United States Patent [19]

Higashi

[11] Patent Number: 4,701,347

[45] Date of Patent: Oct. 20, 1987

[54] METHOD FOR GROWING PATTERNED METAL LAYERS

[75] Inventor: Gregg S. Higashi, Basking Ridge, N.J.

[73] Assignee: American Telephone and Telegraph Company, AT&T Bell Laboratories, Murray Hill, N.J.

[21] Appl. No.: 853,676

[22] Filed: Apr. 18, 1986

[51] Int. Cl.[4] .............................................. B05D 3/06
[52] U.S. Cl. .................................... 437/246; 427/90
[58] Field of Search ............................ 427/53.1, 54.1; 204/157.3, 157.4, 157.41

[56] References Cited

U.S. PATENT DOCUMENTS

| | | | |
|---|---|---|---|
| 3,061,465 | 10/1962 | Norman et al. | 427/54.1 |
| 3,271,180 | 9/1966 | White . | |
| 4,133,908 | 1/1979 | Madsen | 427/98 |
| 4,340,617 | 7/1982 | Deutsch et al. . | |

OTHER PUBLICATIONS

*Applied Physics Letters* 5/15/80 pp. 847–849, vol. 36 T. F. Deutsch, D. J. Ehrlich, R. M. Osgood, Jr., and Z. L. Liau "Omic Contact Formation On InP by Pulsed Laser Photochemical Doping."

*Applied Physics Letters* 9/15/84 pp. 617–619, vol. 45 J. Y. Tsao and D. J. Ehrlich "Patterned Photonucleation of Chemical Vapor Deposition of Al by UV-Laser Photodeposition."

*Primary Examiner*—John H. Newsome
*Attorney, Agent, or Firm*—Richard D. Laumann

[57] ABSTRACT

Patterned metal growth is obtained on a substrate by illuminating the substrate in the presence of a metal containing molecule adsorbed on the substrate. After initial illumination, the photoreacted molecules catalyze further metal growth without further illumination.

11 Claims, 2 Drawing Figures

METHOD FOR GROWING PATTERNED METAL LAYERS

Technical Field

This invention relates generally to a method of growing patterned metal layers in a semiconductor device fabrication technique and particularly to such a method which uses laser activated chemical vapor deposition.

Background of the Invention

For many semiconductor device fabrication techniques, as well as for other types of device fabrication, it is often desired to pattern metal layers or films. There are at least two approaches to this task: (1) patterning the metal film after it has been deposited, and (2) depositing the metal film directly in the desired pattern. It is to the latter approach that this invention is directed.

One of the first reports of a process directed to the latter approach is described in U. S. Pat. No. 3,271,180 issued on Sept. 6, 1966. The described method begins by forming an adsorbed layer of an organic substance on a substrate. The organic substance adsorbed is then irradiated to thereby photolytically react those portions of the adsorbed layer that are illuminated by the light source. Of course, the adsorbed substance is selected so that it has the desired photolytic properties. The adsorbed material is exposed with a mask between the light source and substrate and the adsorbed material decomposes.

A more recent report is by Deutsch et al. in *Applied Physics Letters*, 36, pp. 847–849, May 15, 1980. The approach reported in this article used excimer lasers to photochemically dope Group III-V compounds to form ohmic contacts. The pulsed laser induced photolysis of metal alkyls.

Similar work is disclosed in U.S. Pat. No. 4,340,617, issued on July 20, 1982. This work used a focused laser beam to photolyze organometallic molecules to deposit metal films. Metal film patterns are thus generated by translating the sample surface under the focused laser beam. Although it is mentioned that projection printing might be used, suitable conditions are not discussed.

Yet another report is by Tsao in *Applied Physics Letters*, 45, pp. 617–619, Sept. 15, 1984. This approach used focused ultraviolet laser illumination on the surface to produce a deposit capable of activating the catalytic decomposition of triisobutylaluminum. The focused ultraviolet laser was scanned across an $SiO_2$ substrate in the presence of the desired vapors to form a thin photodeposited film. This surface was subsequently heated with a $CO_2$ laser to catalytically decompose vapors of triisobutylaluminum into aluminum film. Thus, the desired aluminum pattern grew on those features which were written by the laser.

However, consideration of the above last-discussed reference shows that they do not permit the desired metal patterns to grow directly without scanning the laser beams across the surface.

Summary of the Invention

I have found that in a method of semiconductor device fabrication, a patterned metal layer may be grown directly on a substrate by illuminating the substrate, which is heated to an elevated temperature, with the desired pattern in the presence of a metal-containing gas which is adsorbed at subatmospheric pressure thereby decomposing the adsorbed metal-containing molecules. The radiation is then turned off, and the metal present on the surface catalyzes the growth of additional metal. In a preferred embodiment, the patterned metal comprises aluminum and the metal-containing gas comprises triisobutylaluminum. Depending upon the intensity of the initial illumination, either a positive or negative image of the pattern may be produced.

DETAILED DESCRIPTION

Figure 1:
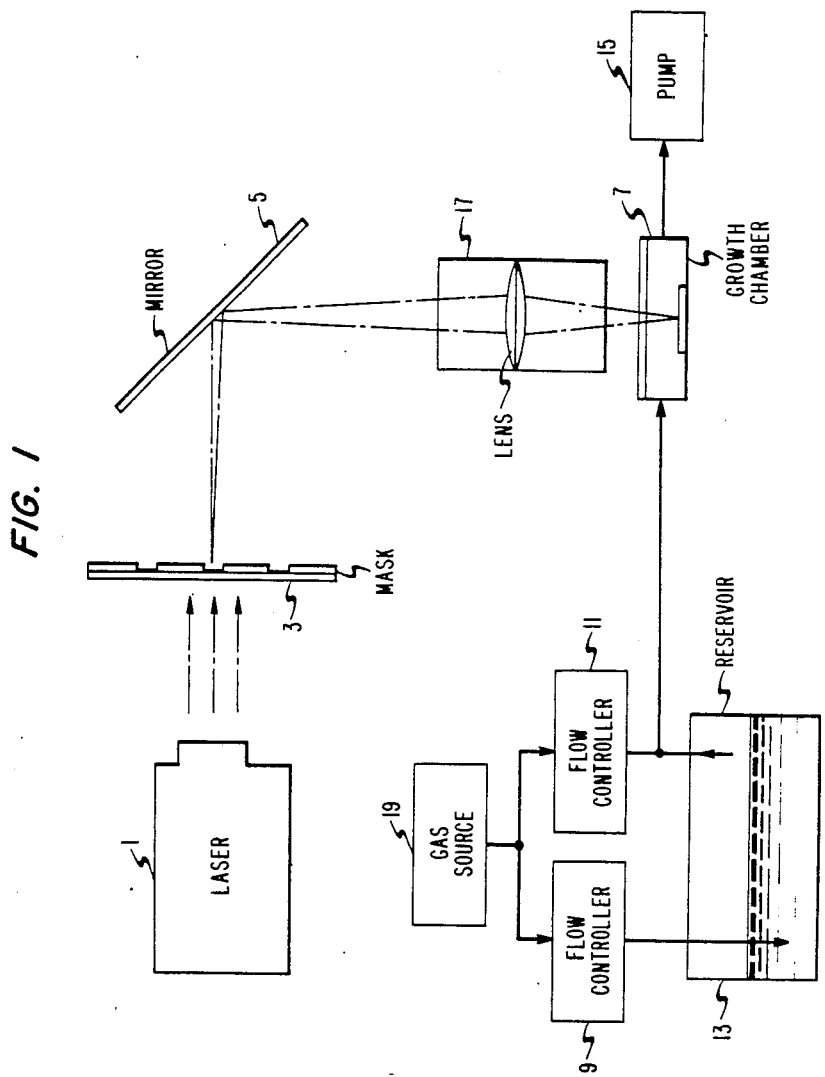
FIG. 1 is a schematic representation of apparatus suitable for the practice of the method of this invention.

A schematic representation of apparatus useful for practicing a method of this invention is depicted in FIG. 1. Depicted are light source 1, mask 3, mirror 5, growth chamber 7, mass flow controllers 9 and 11, gas reservoir 13, and pump 15. Lens 17 permits the mask image to be imaged onto the substrate. The reservoir contains the metal-containing molecule. Gas source 19 is used if a carrier gas is desired.

The light source was a excimer laser, such as one using KrF, which operated at a repetition rate of 100 Hz. Such lasers are desirable because of, for example, their relatively high intensity output. The precise repetition rate is not critical. It should, of course, emit at a frequency absorbed by the molecule. The power delivered to the substrate determines whether a positive or negative image is produced. A low power level produces growth in the illuminated areas, by photolyzing said adsorbed molecules, while a high power level produces growth in the non-illuminated areas. High power is believed to result in gas phase reactions with the products diffusing to the non-illuminated areas while inhibiting growth in the illuminated areas for reasons not perfectly understood.

The growth chamber was a stainless steel cell which desirably has heating means which enable the substrate temperature to be raised during growth. It has been found desirable to heat only the substrate at approximately 250° C. with the remainder of the chamber remaining only slightly above ambient temperature.

The reactant molecules are transported to the growth chamber through stainless steel tubing from the reservoir. It has been found desirable to grow at growth chamber pressure between 0.05 and 0.15 Torr. Lesser pressures lead to undesirably slow growth rates, and higher pressures lead to bad growth morphology. The molecule should surface react to leave metal behind when irradiated. The radiation will typically be light from, e.g., a laser, capable of decomposing the molecule although it is to be understood that electron or ion beams might also be used to achieve the same decomposition.

A carrier gas is generally not used except for flushing the growth chamber. For some reactant gas molecules, such as $WF_6$, a carrier gas, e.g., $H_2$, is required for the surface catalysis reaction.

An exemplary growth technique for a $SiO_2$ substrate will be first described in detail, and variations will then be discussed. The desired substrate is solvent degreased, acid etched, rinsed in de-ionized water, and blown dry with, for example, $N_2$. These preparatory steps are well known in the semiconductor art and need not be described in more detail. It is then placed in the growth chamber, and the substrate temperature is raised to approximately 250° C. After the cell temperature has stabilized, the reactant gas and $H_2$ are allowed to flow through the cell to purge it of contaminants. After purging has been completed, the flow of $H_2$ is stopped, and the substrate is illuminated through the illumination system depicted. A typical duration of the illumination period is between 15 and 600 seconds with each pulse depositing approxiamtely 10–20 $mJ/cm^2$ at the substrate surface. The reactant molecule is triisobutylaluminum (TIBA).

Within several seconds, small silvery islands of aluminum become visible and coalesce into the illuminated pattern. As the growth proceeds, the films become increasingly rough and scatter more light. It should be emphasized that after the initial illumination, the light source is turned off and the metal growth proceeds without additional illumination. At higher illumination levels, growth proceeds in the non-illuminated area.

Various substrate materials were investigated which varied in thermal conductivity and optical absorbance and it was found that nearly identical results were obtained with respect to the number of pulses required to initiate uniform growth at fixed fluence per pulse. It was additionally found that decreasing the normally used fluence per pulse by a factor and increasing the number of pulses by the identical factor resulted in uniform growth again being obtained. These results are believed to attest to the photolytic nature of laser activation processes.

It was additionally observed that small bare areas surrounded by uniform deposits were obtainable. It is noted that this type of feature would be extremely difficult, perhaps impossible, to reproduce if gas phase photoreactions dominated the activation process. This is true because gas phase reactions would lead to products simultaneously diffusing in all directions and would likely fill a small area contained in an otherwise uniformly illuminated area.

This hypothesis was tested by reducing the gas phase reactant to a minimum during the laser activation process. It was found that patterned films were produced with equal efficiency in this manner thus supporting the belief that only surface adsorbate photoreactions need participate. This is critical because feature resolution will be controlled by the ability to image the light source and not by gas phase diffusion lengths. Currently available optical elements can image to the diffraction limit and should permit the reproduction of 0.5 $\mu m$ features using a light source emitting at 250 nm.

It is noted that uniform deposits have been activated with exposures as short as 10 seconds and which correspond to a total fluence of 20 $J/cm^2$. The work discussed earlier by Tsao required total fluences approximately ten thousand times greater in order to nucleate their film growth. The present invention also activates and grows film at a fixed temperature while Tsao found it impossible to laser activate film growth at elevated temperatures. It is noted that Tsao used a highly localized heat source, namely, a $CO_2$ laser focused to approximately 100 $\mu m$ for the thermal growth segment of their process. It is believed that TIBA decomposes into diisobutylaluminum-hydride (DIBAH) as well as butylenes at temperatures above 50° C. It is known that DIBAH has an equilibrium vapor pressure which is lower than that of TIBA and adlayers can form at lower pressure or at significantly higher temperatures. If it is additionally assumed that these layers have a substantial residence time on the substrate, the hypothesis that laser activation involves a surface photoreaction becomes plausible. Tsao was probably unable to create a significant DIBAH partial pressure because he heated only a small area of material and thus did not form the requisite adlayer.

It might be believed that because the described technique relies upon the adsorption behavior and the growth nucleation properties of the substrates, that the desired selective area activation step, required to produce the desired patterns, might be unable to compete with spontaneous or non-selective growth nucleation. Thus, it is not completely unexpected, after the fact, that the method works as described on the chemically inert $SiO_2$. However, other substrates, including $Al_2O_3$, Si, $SiO_2$/Si, GaAs, Al, Cr and Au, were also investigated. After the requisite chemical preparation was performed, patterns having the desired selectivity were grown on these substrates. Selectivity obtained when Al was deposited on preexisting Al wires means that the native oxide on the Al is sufficient to block non-selective growth, since Al would certainly grow on Al. Suprisingly, extremely good, i.e., low resistance, Al/Al contacts were obtained. The native oxide in conventional deposition technique blocks contact formation. This result for multilevel interconnects is important. It should also be mentioned that the surface need not be chemically uniform. For example, good results were also obtained when openings were selectively made in an $SiO_2$ layer on Si. This is obviously important for making field effect transistors. Also, good conformal coverage was obtained, as growth was obtained on both the oxide and the oxide cuts.

The degree of spatial selectivity on the surface of a GaAs substrate is also surprising because this surface is not chemically inert. For example, it is known that it acts to catalytically decompose trimethylgallium and arsine to grow GaAs. It is believed that several monolayers of native oxide are formed prior to introducing the substrate into the growth chamber and these are sufficient to block the surface reaction.

Figure 2:
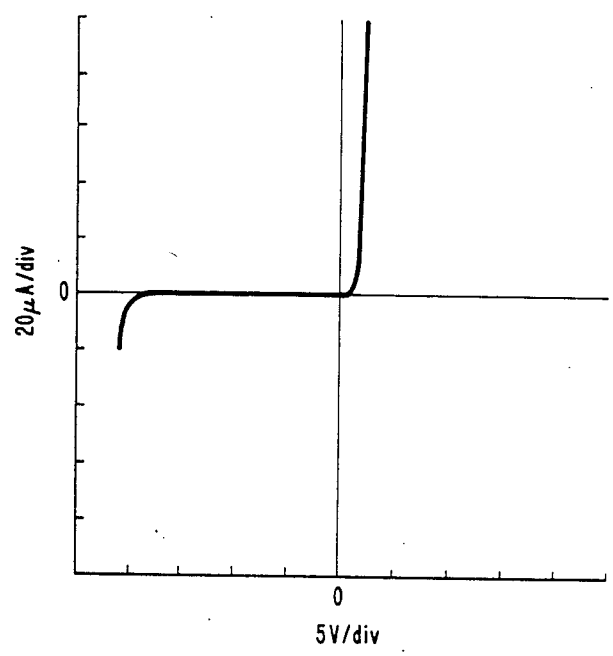
FIG. 2 is the current versus voltage characteristic curve for aluminum contacts made on GaAs using the method of this invention.

However, oxide layers may be detrimental to the usefulness of this method for making devices if present in undesired quantity. Depositions were performed on lightly doped n-type GaAs as an initial test of the quality of contacts formed. A representative I-V characteristic curve is depicted in FIG. 2. This figure depicts the current vertically in units of 20 $\mu a$ per division and voltage horizontally in units of 5 volts per division. The particular device is a dot approximately 25 $\mu m$ in diameter and the curve indicates that diode like behavior is obtained. The reverse breakdown voltage, between 15–18 volts, is typical of GaAs and indicates that no substantial substrate damage occurred during the laser activation process. However, the relatively high forward biased turn-on voltage, approximately 1–2 volts, suggests the presence of a small amount of surface oxide.

The resistivity of the metal features produced approaches that of bulk Al indicating that high speed operation can be obtained. Other embodiments are contemplated. For example, Al atoms can be used to dope Si p-type thereby, for example, forming a p-n junction if the Si were initially n-type or forming ohmic contacts if the Si is p-type or $n^+$. Ohmic contacts have been fabricated and are good candidates for source and drain contacts for field effect transistors (FET) since metal depositions on $SiO_2$ are used for FET gates. Complete transistor fabrication is envisioned and has been demonstrated. It is desirable to anneal, after deposition, at a temperature between 450 and 600° C. for a time between 1 and 10 minutes.

It must also be emphasized that the reactant gas need not be a metal-organic molecule. Any system which grows by surface catalysis can be used. Additional metals, such as Ti, can also be deposited.

What is claimed is:

1. A method of semiconductor device fabrication including the step of forming patterned metal on a surface, said forming step comprising the steps of
    forming an adsorbed layer of metal containing molecules on said surface from a gaseous atmosphere containing said molecules, said molecules having a partial pressure less than one atmosphere and said surface heated to an elevated temperature;
    imaging the desired pattern on said substrate by radiation thereby photolytically decomposing said molecules and leaving metal on said surface; and
    catalytically growing an additional quantity of the same metal from said atmosphere on the photolytically deposited metal.

2. A method as recited in claim 1 in which said metal containing molecule is a molecule which decomposes surface catalytically.

3. A method as recited in claim 2 in which said metal is selected from the group consisting of Al, Ti and W.

4. A method as recited in claim 1 in which said surface comprises at least one material selected from the group consisting of GaAs, $SiO_2$, Si, Al, Au, Cr and $Al_2O_3$.

5. A method as recited in claim 3 in which said metal comprises Al.

6. A method as recited in claim 5 in which said metal containing molecule comprises triisobutylaluminum.

7. A method as recited in claim 2 in which said metal is left in irradiated areas.

8. A method as recited in claim 2 in which said metal is left in non-irradiated areas.

9. A method as recited in claim 5 in which said surface comprises Al and a portion of multi-level interconnects are formed.

10. A method as recited in claim 5 in which said Al forms source and drain controls of a field effect transistor.

11. A method as recited in claim 10 comprising the further step of annealing said deposited Al.

* * * * *